United States Patent
Isono (10) Patent No.: US 6,719,412 B2
(45) Date of Patent: Apr. 13, 2004

(54) PIEZOELECTRIC ACTUATOR AND INK EJECTOR USING THE PIEZOELECTRIC ACTUATOR

(75) Inventor: Jun Isono, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/154,972

(22) Filed: May 28, 2002

(65) Prior Publication Data

US 2003/0001931 A1 Jan. 2, 2003

(30) Foreign Application Priority Data

Jun. 14, 2001 (JP) ......................................... 2001-179906

(51) Int. Cl.$^7$ ................................................. B41J 2/045
(52) U.S. Cl. ................................................................. 347/72
(58) Field of Search ........................ 347/68–72; 310/311, 310/312

(56) References Cited

U.S. PATENT DOCUMENTS

| | | | |
|---|---|---|---|
| 5,402,159 A | | 3/1995 | Takahashi et al. |
| 5,643,379 A | * | 7/1997 | Takeuchi et al. .............. 347/72 |
| 5,729,264 A | * | 3/1998 | Pankert et al. ................. 347/71 |
| 6,273,558 B1 | * | 8/2001 | Kitahara ....................... 347/72 |
| 6,353,420 B1 | * | 3/2002 | Chung ......................... 343/895 |

FOREIGN PATENT DOCUMENTS

JP B2 7-96301 10/1995

* cited by examiner

*Primary Examiner*—Stephen D. Meier
*Assistant Examiner*—An H. Do
(74) *Attorney, Agent, or Firm*—Oliff & Berridge, PLC (57) ABSTRACT

A piezoelectric actuator is formed by laminating a piezoelectric sheet having individual electrodes and a piezoelectric sheet having a common electrode alternately. Through-holes are formed in the laminated piezoelectric sheets and coated with a conductive material to electrically connect the individual electrodes as well as the common electrodes in the laminating direction of the piezoelectric sheets. The maximum diameter ($\phi$) of each through-hole is not less than about 20 $\mu$m and not more than about 200 $\mu$m (20 $\mu$m$\leq\phi\leq$200 $\mu$m). In addition, the through-holes are provided in a staggered configuration in the laminating direction. In this arrangement, the piezoelectric actuator is less prone to warpage or waving and remains flat enough to offer high performance.

27 Claims, 4 Drawing Sheets

PIEZOELECTRIC ACTUATOR AND INK EJECTOR USING THE PIEZOELECTRIC ACTUATOR

BACKGROUND OF THE INVENTION

1. Field of Invention

The invention relates to a piezoelectric actuator and an ink-jet head using a piezoelectric actuator, and more particularly relates to a flat piezoelectric actuator that is less prone to warpage or waving, and to an ink-jet head using such a piezoelectric actuator.

2. Description of Related Art

A piezoelectric actuator converts electric energy to a mechanical displacement to thereby cause movement of a mechanism. Such a piezoelectric actuator is assembled with various parts into an end product, such as an ink-jet head for an ink-jet printer.

As disclosed in U.S. Pat. No. 5,402,159, a conventional on-demand type piezoelectric ink-jet head includes a cavity plate and a piezoelectric actuator. The cavity plate has a plurality of nozzles and pressure chambers, each associated with one of the nozzles. The piezoelectric actuator is formed by laminating piezoelectric sheets, each of which is sandwiched by individual flat electrodes provided individually for the pressure chambers and a common electrode provided commonly for the pressure chambers. The piezoelectric actuator is stacked on the cavity plate such that the individual electrodes are aligned with the corresponding pressure chambers in the cavity plate.

In the piezoelectric actuator of the ink-jet head structured as described above, through-holes are formed in the piezoelectric sheets, as proposed in Japanese Patent Publication No. 7-96301, to electrically connect the individual electrodes and the common electrodes in the piezoelectric sheet laminating direction. Through-holes are formed to penetrate the piezoelectric sheets in the thickness direction at positions corresponding to the individual electrodes and the common electrodes, and are filled with a conductive paste.

Usually, green sheets formed with electrodes and through-holes are laminated and sintered into a single body. Then, the sintered body undergoes polarization to gain a piezoelectric property, and is produced as a piezoelectric actuator.

However, the green sheets formed with thorough-holes shrink locally during the sintering. As a result, warps or waves are produced in the sintered body (piezoelectric actuator). As the through-hole diameter becomes large, warps or waves become serious and thus flatness of the resultant piezoelectric actuator is degraded.

If a warped or wavy piezoelectric actuator is used in an ink-jet head, a gap is created between the piezoelectric actuator and a cavity plate when they are bonded. Such a bonding failure results in ink leaks and improper ink ejection.

Other than use in an ink-jet head, a piezoelectric actuator is generally placed over or incorporated into other parts. When a piezoelectric actuator is not flat, the piezoelectric actuator is not properly joined or bonded to a mating part, and a resultant end product only delivers limited performance.

SUMMARY OF THE INVENTION

The invention addresses the forgoing problems and provides a piezoelectric actuator that is less prone to warpage or waving and flat enough to offer high performance. The invention also provides an ink-jet head using such a piezoelectric actuator.

According to one aspect of the invention, a piezoelectric actuator includes first piezoelectric sheets and second piezoelectric sheets. Each of the first piezoelectric sheets has inner individual electrodes, and each of the second piezoelectric sheets has an inner common electrode. The first and second piezoelectric sheets are laminated alternately. Though-holes are formed in the first and second piezoelectric sheets and coated with a conductive material such that the inner individual electrodes are electrically connected, at their end portions, with one another in a laminating direction of the first and second piezoelectric sheets and the common electrodes are electrically connected, at their at least one end portion, with one another in the laminating direction. The maximum diameter of each of the through-holes is not less than about 20 µm and not more than about 200 µm.

When the maximum diameter of each of the through-holes is within this range, warps and waves that may be produced during the manufacturing process of the piezoelectric actuator are reduced and a flat piezoelectric actuator is obtained.

According to another aspect of the invention, the piezoelectric actuator is stacked on a cavity plate formed with pressure chambers and nozzles, each communicating with a corresponding one of the pressure chambers. The first piezoelectric sheets extend across the pressure chambers, and the inner individual electrodes on each of the first piezoelectric sheets are each aligned with a corresponding one of the pressure chambers. The second piezoelectric sheets extend across the pressure chambers, and the inner common electrode on each of the second piezoelectric sheets extends across the pressure chambers.

When the piezoelectric actuator, that is flat, is bonded to the cavity plate, no gap is created therebetween, and no ink leaks result.

BRIEF DESCRIPTION OF THE DRAWINGS

A preferred embodiment of the invention will be described in detail with reference to the following figures, in which like elements are labeled with like numbers in which.

DETAILED DESCRIPTION OF PREFERRED EMBODIMENTS

One embodiment of the invention will be described with reference to FIGS. 1 through 4. A piezoelectric actuator according to one embodiment of the invention is formed by laminating piezoelectric sheets. Inner electrodes disposed on the piezoelectric sheets are electrically connected to one another by through-holes coated with a conductive material. The piezoelectric actuator is stacked on a cavity plate to form an ink-jet head.

Figure 1:
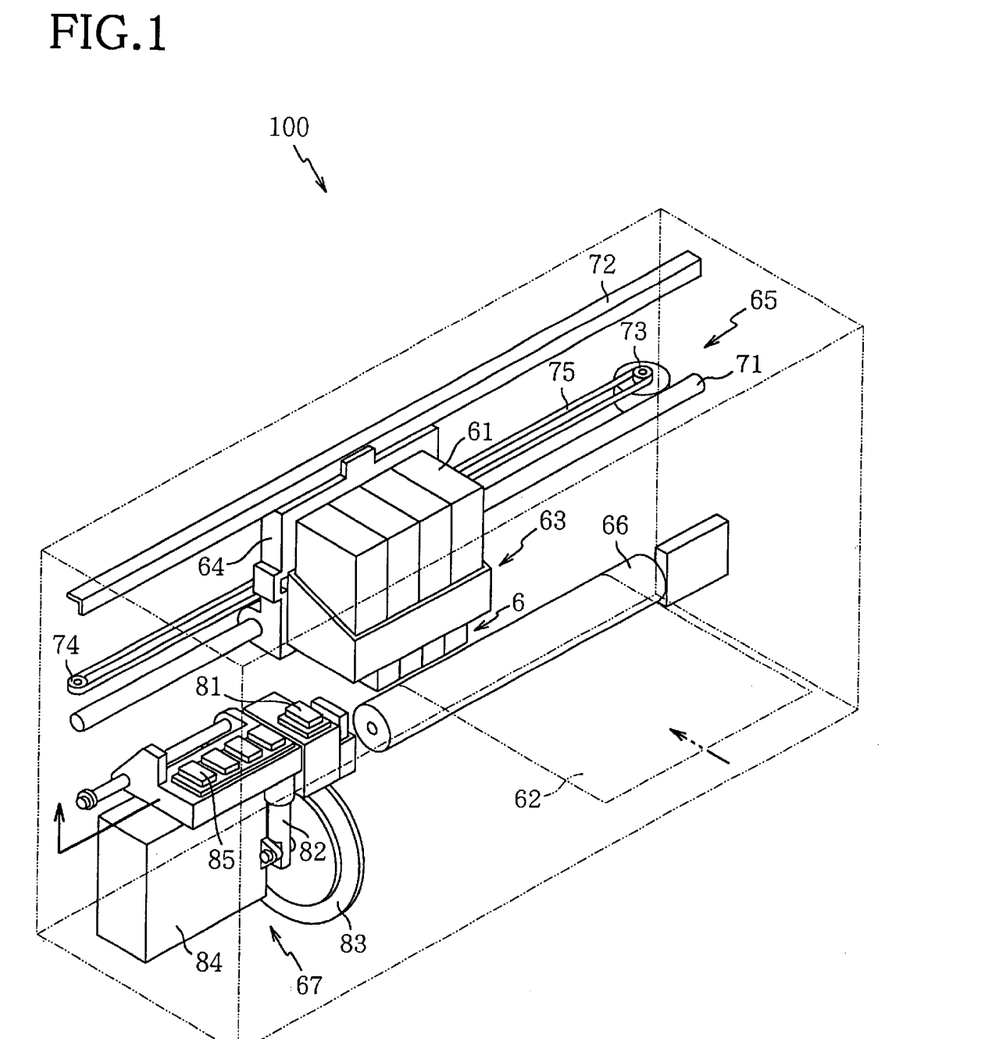
FIG. 1 is a perspective view of a color ink-jet printer for which a piezoelectric ink-jet head according to an embodiment of the invention is used.

FIG. 1 is a perspective view of a color ink-jet printer 100 using ink-jet heads 6. As shown in FIG. 1, the color ink-jet printer 100 includes ink cartridges 61 filled with cyan, magenta, yellow, and black inks, respectively, a head unit 63 having the ink-jet heads 6 that print on a sheet (recording medium) 62, a carriage 64 on which the ink cartridges 61 and the head unit 63 are mounted, a drive unit 65 that linearly reciprocates the carriage 64, a platen roller 66 disposed facing the ink-jet head 6, and a purge device 67.

The drive unit 65 includes a carriage shaft 71 disposed at the lower end of the carriage 64 and extending parallel to the platen roller 66, a guide plate 72 disposed at the upper end of the carriages 64 and extending parallel to the carriage shaft 71, two pulleys 73, 74 disposed between the carriage shaft 71 and the guide plate 72 and at both ends of the carriage shaft 71, and an endless belt 75 looped over the pulleys 73, 74 and connected to the carriage 64.

When the pulley 73 is driven by a motor to rotate forward and in reverse, the carriage 64 connected to the endless belt 75 linearly reciprocates along the carriage shaft 71 and the guide plate 72.

The sheet 62 is supplied from the sheet feed cassette (not shown) provided at one side of the ink-jet printer 100, and is guided between the ink-jet heads 6 and the platen roller 66, where the ink-jet heads 6 eject ink to print a predetermined image on the sheet 62. Thereafter, the sheet 62 is discharged. A sheet feed mechanism and a sheet discharge mechanism are not shown in FIG. 1.

The purge device 67 is disposed at one side of the platen roller 66 so as to face the ink-jet heads 6 when the head unit 63 is in the reset position. The purge device 67 includes a purge cap 81 that contacts and covers openings of the nozzles provided in any one of the ink-jet heads 6, a pump 82, a cam 83, and an ink tank 84. The purge device 67 covers the nozzles of any one of the ink-jet heads 6 with the purge cap 81 when the head unit 63 is in the reset position, and sucks inferior ink containing air bubbles and remaining inside the ink-jet head 6. As a result, the ink-jet head 6 is restored to the initial state. The sucked waste ink is stored in the ink tank 84. Caps 85 are provided to cover nozzles of corresponding ink-jet heads 6 to prevent drying of ink in the ink-jet heads 6.

The head unit 63 has a mount to which the four ink cartridges 61 are detachably attached. Ink supply passages, each connectable to an ink outlet of the corresponding ink cartridge 61, are provided on one side of the mount and reach the lower surface of a bottom plate (not shown) of the head unit 63. Packings, made of rubber or other material, are provided for the ink supply passages so as to hermetically contact ink supply holes 19a, 19b (FIG. 2) provided for each ink-jet head 6. Ink stored in each ink cartridge 61 is supplied, through the corresponding ink passage and supply holes 19a, 19b, to the corresponding ink-jet head 6.

Figure 2:
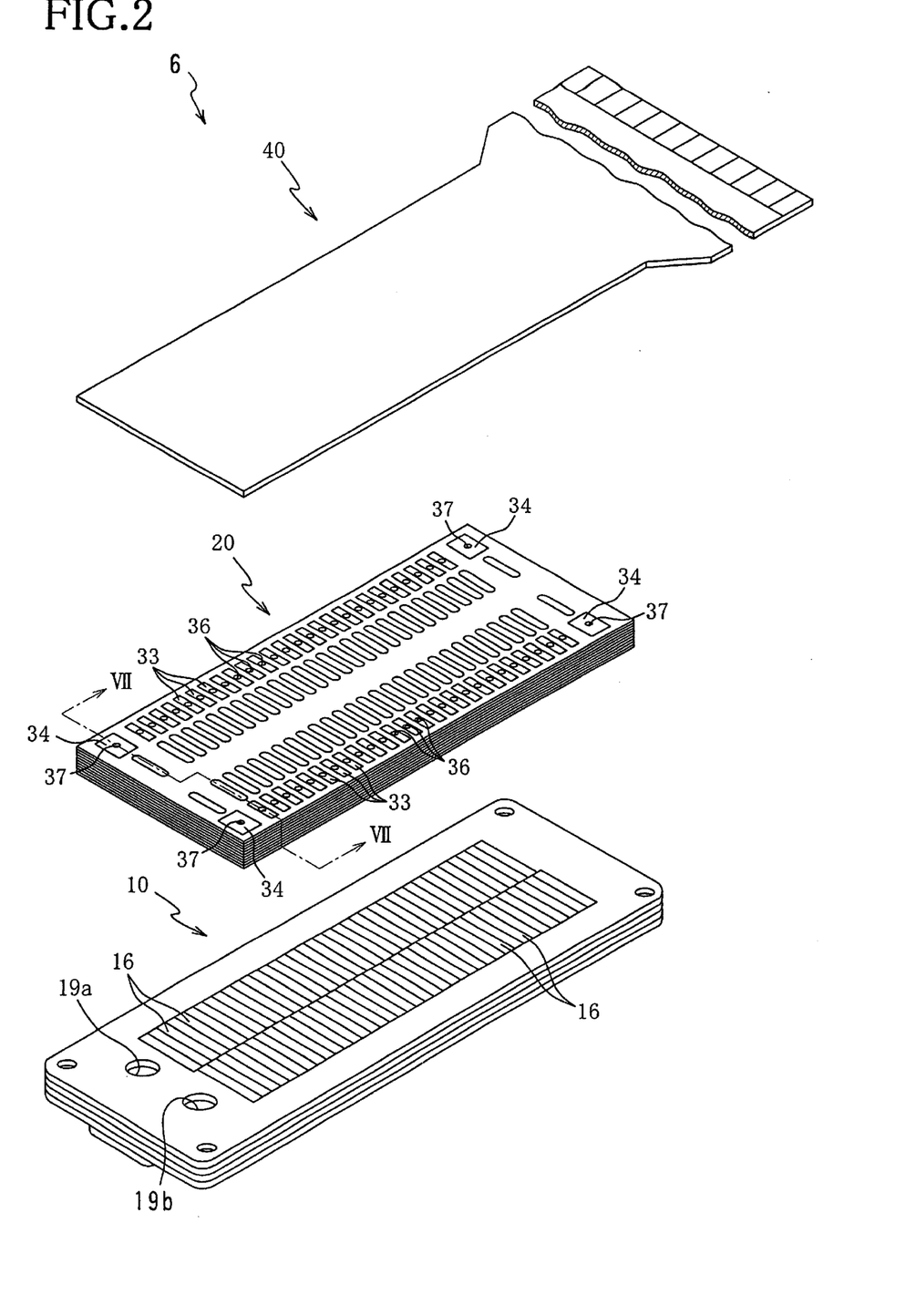
FIG. 2 is a perspective view of various parts of the piezoelectric ink-jet head.

FIG. 2 is a perspective view of each ink-jet head 6. As shown in FIG. 2, the ink-jet head 6 is formed by stacking a laminated cavity plate 10 on a plate-type piezoelectric actuator 20.

Pressure chambers 16 are arranged in two rows in a staggered configuration in the cavity plate 10. Each pressure chamber 16 is narrow and extends perpendicular to the longitudinal direction of the cavity plate 10. Nozzles (not shown), each communicating with a corresponding pressure chamber, are provided so as to be open toward the lower surface of the cavity plate 10 for ink ejection. Ink from each ink cartridge 61 is supplied, through the corresponding ink supply passage and ink supply holes 19a, 19b, to the corresponding pressure chambers 16.

The piezoelectric actuator 20 is bonded to the cavity plate 10 using an adhesive agent or an adhesive sheet. The piezoelectric actuator 20 is formed by laminating piezoelectric sheets 21–30 (FIG. 3) and is designed to apply pressure individually to each pressure chamber 16. Provided on the upper surface of the uppermost piezoelectric sheet 21 are surface electrodes 33, 34 that correspond respectively to individual electrodes 31 and common electrodes 32 (FIG. 3) provided on lower piezoelectric sheets 22–30. The surface electrodes 33, 34 are connected to a flexible flat cable 40 that is bonded to the upper surface of the piezoelectric actuator 20. Thus, a control circuit of the color ink-jet printer 100 is electrically connected to the piezoelectric actuator 20. When ink is ejected from a selected pressure chamber 16 according to predetermined print data, a drive voltage is applied by the control circuit to the individual electrode 31 aligned with the selected pressure chamber 16 and the common electrodes 32, via the surface electrodes 33, 34. As a result, the piezoelectric actuator 20 is deformed locally to change the volume of the selected pressure chamber 16, and ink is ejected from the nozzle communicating with the selected pressure chamber 16.

Figure 3:
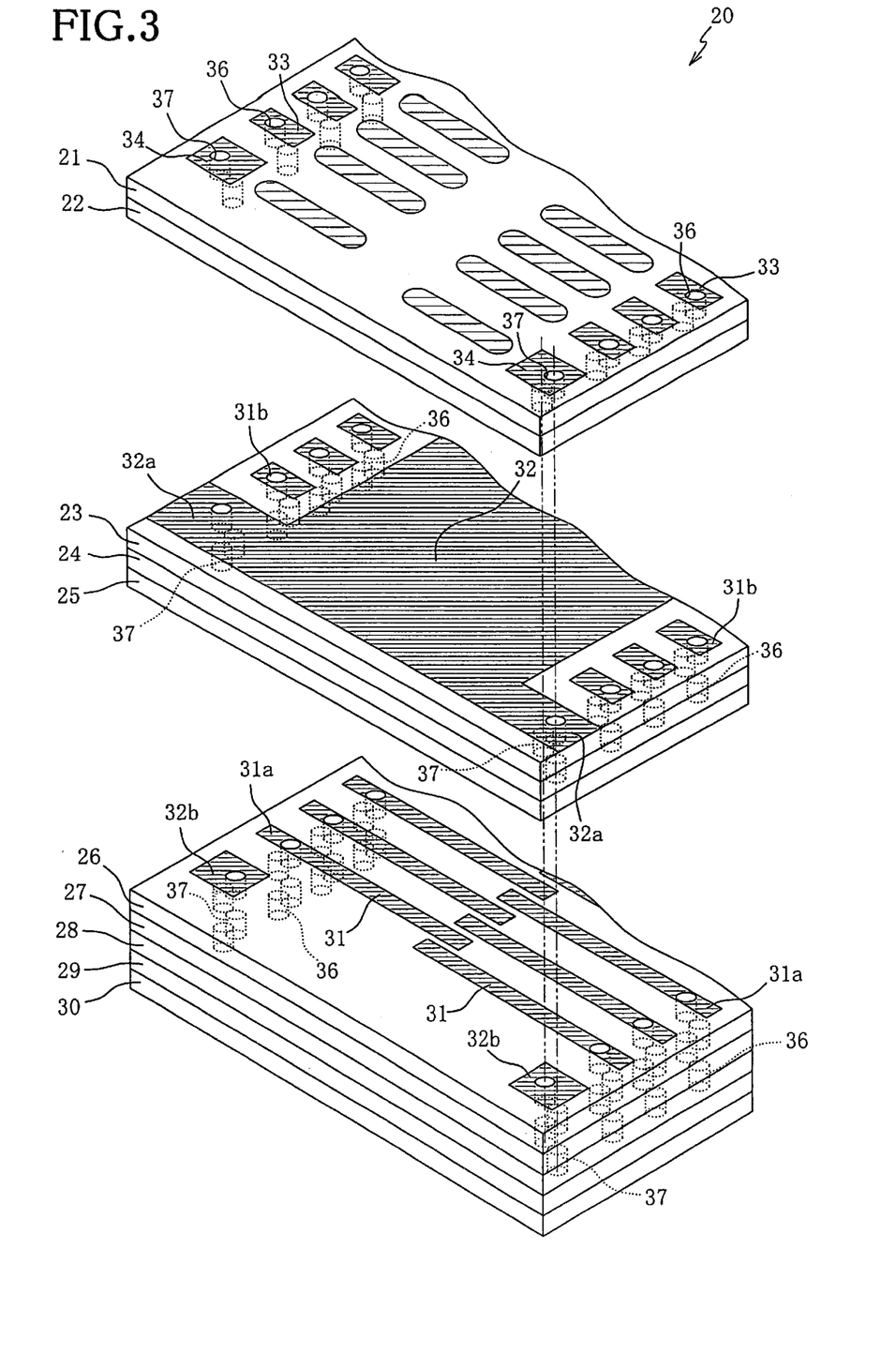
FIG. 3 is an enlarged exploded view of a piezoelectric actuator used in the piezoelectric ink-jet head.

The detailed structure of the piezoelectric actuator 20 will be described with reference to FIGS. 3 and 4. FIG. 3 is an exploded perspective view of the plate-type piezoelectric actuator 20. As shown in FIG. 3, the piezoelectric actuator 20 is formed by laminating ten piezoelectric sheets 21–30, each having a thickness of 30 $\mu$m. Out of the ten piezoelectric sheets, piezoelectric sheets 26, 28, 30 are first piezoelectric sheets, each of which has individual electrodes 31, and piezoelectric sheets 25, 27, 29 are second piezoelectric sheets, each of which has a common electrode 32. The first and second piezoelectric sheets are laminated alternately.

In addition, through-holes 36, 37 are formed to penetrate each piezoelectric sheet 21–29. A conductive material that coats an inner wall of each through-hole 36, 37 continues to an electrode (an individual electrode 31, a common electrode 32, or a dummy electrode 31b, 32b) provided on the upper surface of each piezoelectric sheet 21–29, and is in contact with an electrode (an individual electrode 31, a common electrode 32, or a dummy electrode 31b, 32b) provided on an adjacent lower piezoelectric sheet. The through-holes 36 are used to electrically connect individual electrodes 31 provided in a laminating direction of the piezoelectric sheets 21–30, while the through-holes 37 are used to electrically connect the common electrodes 32 provided in the laminating direction.

More specifically, narrow individual electrodes 31 are formed on the upper surface of each piezoelectric sheet 26, 28, 30 so as to be aligned with the pressure chambers 16 (FIG. 2) in the cavity plate 10. Additionally, dummy electrodes 32b, which are not involved in deformation of the piezoelectric sheets, are formed on the upper surface of each piezoelectric sheet 26, 28, 30 so as to be aligned with end portions 32a of each common electrode 32, which will be described later. A through-hole 36 is formed at an end portion 31a of each individual electrode 31, and a through-hole 37 is formed in each dummy electrode 32b. In other words, each through-hole 36, 37 is bordered with an electrode (an individual electrode 31 or a dummy electrode 32b) provided on the upper surface of each piezoelectric sheet 26, 28, 30.

A common electrode 32, which is identical to a common electrode 32 formed on the piezoelectric sheet 23 shown in FIG. 3, is formed on the upper surface of each piezoelectric sheet 25, 27, 29, as a single strip extending over the pressure chambers 16. Additionally, dummy electrodes 31b, not involved in deformation of the piezoelectric sheets, are formed on the upper surface of each piezoelectric sheet 25, 27, 29 so as to be aligned with end portions 31a of the individual electrodes 31. Through-holes 37 are formed in end portions 32a of each common electrode 32, and a through-hole 36 is formed in each dummy electrode 31b. In other words, each through-hole 36, 37 is bordered with an electrode (a common electrode 32 or a dummy electrode 31b) provided on the upper surface of each piezoelectric sheet 25, 27, 29.

A common electrode 32 as well as dummy electrodes 31b aligned with end portions 31a of the individual electrodes are provided also on the upper surface of each piezoelectric sheet 22, 23, 24. However, the piezoelectric sheets 22, 23, 24 do not operate piezoelectrically, but serve as restraining sheets against deformation in the piezoelectric sheets 25–29. The piezoelectric sheets 22, 23, 24 restrict upward transmission of piezoelectric deformation caused in the piezoelectric sheets 25-29 and direct the deformation downwardly toward the cavity plate 10. As a result, pressure is efficiently applied to the pressure chambers 16 in the cavity plate 10. In each piezoelectric sheet 22, 23, 24, similarly to other piezoelectric sheets 25–29, through-holes 37 are formed at end portions 32a of each common electrode 32, and a through-hole 36 is formed at each dummy electrode 31b.

On the upper surface of the uppermost piezoelectric sheet 21, surface electrodes 33, aligned with the individual electrodes 31, and surface electrodes 34, aligned with the end portions 32a of the common electrodes 32, are provided in two rows along the side edges of the piezoelectric sheet 21, parallel to a direction in which the individual electrodes 31 are arranged. As described above, the flexible flat cable 40 is bonded to the piezoelectric sheet 21. The flexible flat cable 40 and the piezoelectric actuator 20 are electrically connected through the surface electrodes 33, 34. Additionally, in the piezoelectric sheet 21, a through-hole 36 is formed at each surface electrode 33, and a through-hole 37 is formed at each surface electrode 34.

The through-holes 36, 37 are substantially cylindrical. The diameter ($\phi$) of each through-hole 36, 37 at the upper surface of the piezoelectric sheet is not less than about 20 $\mu$m and not more than about 200 $\mu$m, and 50 $\mu$m in this embodiment. Each through-hole 36, 37 is tapered toward the lower surface of the piezoelectric sheet, and the diameter ($\phi$) of each through-hole 36, 37 at the lower surface of the piezoelectric sheet is about 70% of the diameter ($\phi$) at the upper surface thereof.

Such through-holes 36, 37 are formed in a green sheet (piezoelectric sheet) by irradiating it with a laser beam. Through-holes formed by this method are generally tapered as described above. A required number of green sheets with through-holes 36, 37 are prepared. Required electrodes (individual electrodes 31 and dummy electrodes 32b, a common electrode 32 and dummy electrodes 31b, or surface electrodes 33, 34) are formed on appropriate green sheets with through-holes 36, 37 by screen-printing using a conductive paste. When the required electrodes are formed by screen-printing, the conductive paste enters each through-hole 36, 37. As a result, an inner wall of each through-hole 36, 37 is coated with the conductive paste and a conductive portion is formed inside the through-hole 36, 37. Thereafter, the required number of green sheets are laminated, and degreased and sintered as a single body. Then, the flexible flat cable 40 is connected to the surface electrodes 33, 34 on the uppermost piezoelectric sheet 21, and a voltage higher than a voltage applied for ink ejection is applied between all the individual electrodes 31 and all the common electrodes 32, thereby polarizing the piezoelectric sheets 25–29, each of which is sandwiched by the individual electrodes 31 and the common electrode 32. As a result, the piezoelectric sheets 25–29 acquire a piezoelectric property and become piezoelectrically active. Such polarization may be performed before the piezoelectric actuator 20 is joined to the cavity plate 10 and the flexible flat cable 40.

Because each of the piezoelectric sheets 21–24 is sandwiched by common electrodes 32 or by a common electrode 32 and surface electrodes 33, 34, the piezoelectric sheets 21–24 are not polarized and thus piezoelectrically inactive. The dummy electrodes 31b, 32b, which are equal in thickness to the individual electrodes 31 and the common electrodes 32, are provided to prevent any piezoelectric sheet from sinking into portions without the individual electrodes 31 or common electrodes 32 when the piezoelectric sheets 21–30 are laminated. Also, the dummy electrodes 31b, 32b are provided to improve electrical conductivity between the through-holes 36, 37.

Figure 4:
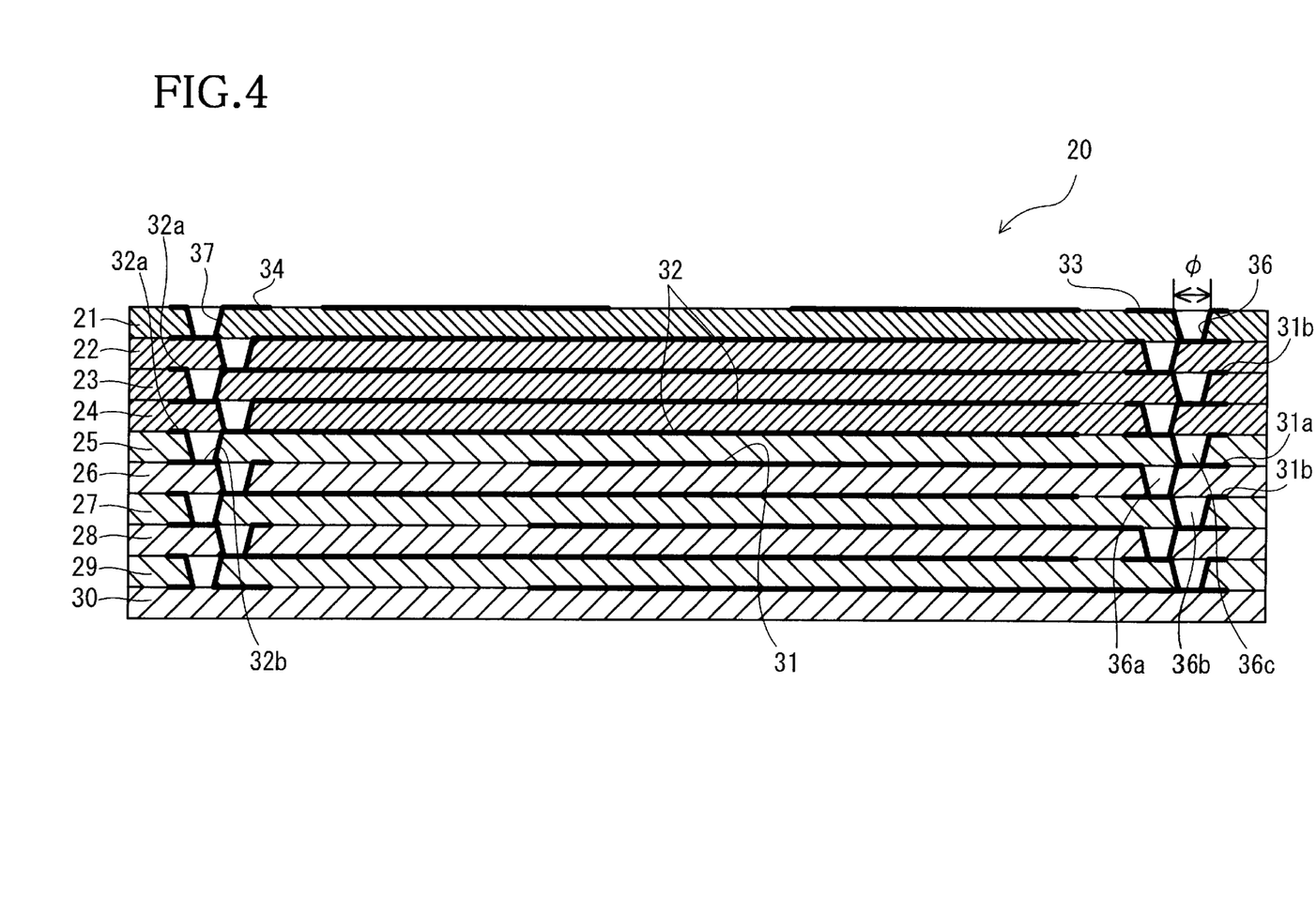
FIG. 4 is an enlarged sectional view taken along line VII—VII of FIG. 2.

FIG. 4 is a sectional view of the piezoelectric actuator 20 taken along line VII—VII of FIG. 2 and viewed in the direction of the arrows. As apparent from FIG. 4, the through-holes 36, 37 formed in the piezoelectric sheets 21, 23, 25, 27, 29 are aligned with one another, and the through-holes 36, 37 formed in the piezoelectric sheets 22, 24, 26, 28 are aligned with one another. However, the through-holes 36, 37 formed in the piezoelectric sheet 21 are not aligned with the through-holes 36, 37 formed in the piezoelectric sheet 22. More specifically, the through-holes 36, 37 formed in the piezoelectric sheets 21, 23, 25, 27, 29 are at more distant positions from the center line of the laminated piezoelectric sheets (closer to opposed longitudinal sides of the laminated piezoelectric sheets) than the through-holes 36, 37 formed in the piezoelectric sheets 22, 24, 26, 28. Thus, the through-holes 36, 37 provided vertically in the laminating direction are not coaxially aligned. When the piezoelectric sheets 21–30 are laminated, the through-holes 36, 37 are provided alternately in a staggered configuration in the laminating direction.

Referring now to three through-holes 36a, 36b, 36c shown in FIG. 4, the positional relationship and the electrical connection of the through-holes 36, 37 will be described. The three through-holes 36a, 36b, 36c are formed in the piezoelectric sheets 26, 27, 25, respectively, and electrically connected, via conductive portions, with one another in the laminating direction. As shown on the right side of FIG. 4, a conductive portion of the through-hole 36a in the piezoelectric sheet 26 continues, at its upper end, to the end portion 31a of the individual electrode 31 on the piezoelectric sheet 26. The conductive portion of the through-hole 36a is in contact, at its lower end, with the dummy electrode 31b on the piezoelectric sheet 27. A conductive portion of the through-hole 36b in the piezoelectric sheet 27 continues, at its upper end, to the dummy electrode 31b on the piezoelectric sheet 27. The conductive portion of the through-hole 36b is in contact, at its lower end, with the end portion 31a of the individual electrode 31 on the piezoelectric sheet 28. In this way, the individual electrodes 31 provided on the piezoelectric sheets 26, 28, 30 and aligned in the laminating direction are connected with one another, via a conductive portion of a through-hole 36, a dummy electrode 31b, and a conductive portion of a though-hole 36.

A conductive portion of the though-hole 36c in the piezoelectric sheet 25 is in contact, at its lower end, with the end portion 31a of the individual electrode 31 on the piezoelectric sheet 26, and continues, at its upper end, to the dummy electrode 31b on the piezoelectric sheet 25. Further, the dummy electrode 31b on the piezoelectric sheet 25 is connected, via a conductive portion of a through-hole 36 and a dummy electrode 31b provided on each piezoelectric sheet 22–24, to the surface electrode 33 on the uppermost sheet 21. As a result, the individual electrode 31 on the piezoelectric sheet 26 is indirectly connected to the surface electrode 33.

Additionally, as shown on the left side of FIG. 4, the common electrodes 32 provided on the piezoelectric sheets 25, 27, 29 and aligned in the laminating direction are connected to one another, via a conductive portion of a through-hole 37, a dummy electrode 32b, and a conductive portion of a through-hole 37. Further, the common electrode 32 on the piezoelectric sheet 25 is connected, via a conductive portion of a through-hole 37 and a common electrode 32 provided on each piezoelectric sheet 22–24, to the surface electrode 34 on the uppermost sheet 21.

As described above, vertically provided adjacent through-holes 36, 37 are not coaxially aligned. In addition, conductive portions of the through-holes 36, 37 are electrically connected with one another via a bordering electrode (an individual electrode 31, a common electrode 32, or a dummy electrode 31b, 32b). This arrangement prevents poor electrical conduction between the electrodes provided in the laminating direction of the piezoelectric sheets 21–29. More specifically, each through-hole 36, 37 is tapered and will not always be completely filled with the conductive paste. A resultant hollow portion in the through-hole is not conductive. For this reason, if two piezoelectric sheets are laminated such that the through-holes 36, 37 are coaxially aligned, it is possible that the lower end of a conductive portion of a through-hole in the upper piezoelectric sheet makes a poor contact with the upper end of a conductive portion of a through-hole in the lower piezoelectric sheet. Especially when coaxially aligned two through-holes 36, 37 are different in diameter at their confronting sides, it is probable that the lower end of a conductive portion of a through-hole in the upper piezoelectric sheet sometimes confronts a hollow in a through-hole in the lower piezoelectric sheet. In such a case, the two through-holes are not brought into conduction. In addition, when the through-holes 36, 37 are straight in shape but not uniform in diameter, it is possible that a conductive portion of one of vertically provided two through-holes confronts a nonconductive portion of the other, causing nonconductivity therebetween, as in the above-described case.

According to the embodiment, however, a conductive portion of each through-hole 36, 37 in one of adjacent piezoelectric sheets partially contacts an end portion of an electrode 31a, 32a or a dummy electrode 31b, 32b that borders a through-hole 36, 37 in the other piezoelectric sheet. Thus, the electrodes provided in the laminating direction are reliably brought into conduction. Even when any through-hole 36, 37 is formed at a position shifted from a desired position, a conductive portion of that through-hole 36, 37 is readily electrically connected, via an end portion of an electrode 31a, 32a or a dummy electrode 31b, 32b, to a conductive portion of an adjacent through-hole 36, 37. In addition, the through-holes 36, 37 are arranged in a staggered configuration in the laminating direction of the piezoelectric sheets 21–29. Thus, the through-holes 37, 38 are provided at different positions, alternately in the laminating piezoelectric sheets, and yet provided in a compact configuration. In other words, the through-holes 36, 37 can be concentrated into a limited area of the piezoelectric sheets. Accordingly, a space for forming the through-holes 36, 37 can be easily provided, and the through-holes 36, 37 do not interfere with forming of the electrodes (individual electrodes 31, common electrodes 32, and dummy electrodes 31b, 32b).

The following table is an evaluation table showing the relative relationship between the diameter of each through-hole and the performance of a given piezoelectric actuator structured as described in the above embodiment.

| Through-hole Diameter | Voltage Drop | Number of Through-holes | Damage | General Evaluation |
|---|---|---|---|---|
| φ < 20 μm | great | many | serious | poor |
| 20 μm ≦ φ ≦ 200 μm | small | few | minor | good |
| φ > 200 μm | small | few | serious | poor |

The maximum diameter of each through-hole is shown in the leftmost "Through-hole Diameter" column. The "Voltage Drop" column shows a voltage drop varying depending on the through-hole diameter. A voltage drop occurs between conductive portions in the through-holes that electrically connect the individual electrodes or the common electrodes aligned in the laminating direction of the piezoelectric sheets. The degree of a voltage drop of a given piezoelectric actuator is expressed as "great" or "small". A "great" voltage drop affects a drive voltage selectively applied to the individual electrodes and the common electrodes, and the pulse rise time of the drive voltage waveform is delayed, resulting in a slow ejection velocity.

The "Number of Through-holes" column shows the number of through-holes required for each individual electrode and each common electrode to keep a voltage drop within a predetermined range. The predetermined range refers to a range where the waveform of a drive voltage is not sufficiently affected so as to cause faulty ink ejection. Electric resistance generated between conductive portions in the through-holes in the aligned individual electrodes or the common electrodes increases as the cross-sectional area of a through-hole or through-holes provided in each individual electrode or common electrode becomes smaller. In other words, as the through-hole diameter becomes smaller and as the number of through-holes decreases, the electric resistance increases and thus the voltage drop increases. The required number of through-holes varies depending on the through-hole diameter shown in the "Through-hole Diameter" column and is expressed as "many" or "few" in the "Number of Through-holes" column.

As the number of through-holes increases, a through-hole machining step must be repeated a greater number of times, and a greater area is required for each individual or common electrode. Thus, electrodes and related parts are restricted in shape and size, and the manufacturing cost of the piezoelectric actuator increases. When the number of through holes is "many", any or all of such inconveniences may arise.

On the right of the "Number of Through-holes" column, the "Damage" column shows the damage to a given piezoelectric actuator. The data shown in the "Damage" column varies depending on the through-hole diameter shown in the "Through-hole Diameter" column and the number of through-holes shown in the "Number of Through-holes" column. The damage shown in the "Damage" column refers to damage, such as warps or waves, produced in a sintered body (piezoelectric actuator) by through-holes of a specified diameter. The degree of damage is expressed as "serious" or "minor".

On the right of the "Damage" column, the "General Evaluation" column shows the performance of a piezoelectric actuator with through-holes having a diameter specified in the "Through-hole Diameter" column. The performance is evaluated as "good" or "poor" considering ink ejecting and leaking conditions. When a sintered body (piezoelectric actuator) is "seriously" damaged and deformed locally around the through-holes, a bonding failure occurs when the piezoelectric actuator is bonded to a cavity plate, resulting in ink leaks.

As shown in the piezoelectric actuator evaluation table, when the maximum through-hole diameter ($\phi$) is less than about 20 $\mu$m ($\phi<20$ $\mu$m), the voltage drop is great due to increased electrical resistance generated between conductive portions in the through-holes. Thus, many through-holes are required to keep the voltage drop within the predetermined range, and damage to a given piezoelectric actuator is serious. As a result, the performance of the piezoelectric actuator is evaluated as poor.

When the maximum through-hole diameter ($\phi$) is more than about 200 $\mu$m ($\phi>200$ $\mu$m), the voltage drop is small and through-holes are few in number, but damage to a given piezoelectric actuator is serious. As a result, the performance of the piezoelectric actuator is evaluated as poor.

When the maximum through-hole diameter ($\phi$) is not less than about 20 $\mu$m and not more than about 200 $\mu$m (20 $\mu$m$\leq\phi\leq$200 $\mu$m), the voltage drop is small, through-holes are few in number, and damage to a given piezoelectric actuator is minor. As a result, the performance of the piezoelectric actuator is evaluated as good.

In the piezoelectric actuator 20 according to the above-described embodiment, by setting the maximum diameter ($\phi$) of each of the through-holes 36, 37 to not less than about 20 $\mu$m and not more than about 200 $\mu$m (20 $\mu$m$\leq\phi\leq$200 $\mu$m), warps and waves are prevented in the piezoelectric actuator 20 and its flatness is desirably maintained even after it is sintered, and a voltage drop in the piezoelectric actuator 20 is reduced. In addition, the piezoelectric sheets 22–24 provided as the deformation restraining sheets, as described above, also reduce warps and waves produced in the piezoelectric actuator 20 during the sintering. Thus, flatness of the piezoelectric actuator 20 is further maintained.

Accordingly, when the piezoelectric actuator 20 is stacked on the cavity plate 10 such that the individual electrodes 31 are aligned with the corresponding pressure chambers 16, the piezoelectric actuator 20 is bonded to the cavity plate 10 without a gap, resulting in no ink leaks. Further, in such a flat piezoelectric actuator 20, good electrical connections are ensured between the individual electrodes 31 and between the common electrodes 32 by through-holes 36, 37 coated with a conductive material and arranged in the staggered configuration in the laminated piezoelectric sheets 22–24. Thus, the piezoelectric actuator 20 demonstrates an excellent electric property (piezoelectric property), and accomplishes excellent ink ejection.

Although the invention has been described with reference to a specific embodiment, the description of the embodiment is illustrative only and is not to be construed as limiting the scope of the invention. Various other modifications and changes may occur to those skilled in the art without departing from the spirit and scope of the invention.

For example, although, in the above-described embodiment, the through-holes 36, 37 are arranged in a staggered configuration, the through-holes 36, 37 may be arranged in a spiral configuration. Further, in the above-described embodiment, a conductive portion of one of vertically placed two through-holes makes contact with a conductive portion of the other, via an electrode (an individual electrode 31, a common electrode 32, or a dummy electrode 31b, 32b). However, a conductive portion of one of vertically placed two through-holes may partially make a direct contact with a conductive portion of the other. In this case, the configuration of the through-holes 36, 37 in the piezoelectric sheets becomes more compact, and the electrodes can be printed on the piezoelectric sheets at a higher density.

What is claimed is:

1. A piezoelectric actuator, comprising:
   first piezoelectric sheets each having inner individual electrodes; and
   second piezoelectric sheets each having an inner common electrode, the first and second piezoelectric sheets being laminated alternately, wherein through-holes are formed in the first and second piezoelectric sheets and coated with a conductive material such that the inner individual electrodes are electrically connected, at their end portions, with one another in a laminating direction of the first and second piezoelectric sheets and that the common electrodes are electrically connected, at their at least one end portion, with one another in the laminating direction, a maximum diameter of each of the through-holes being not less than about 20 $\mu$m and not more than about 200 $\mu$m.

2. The piezoelectric actuator according to claim 1, wherein the through-holes are not formed in a bottom one of the laminated first and second piezoelectric sheets.

3. The piezoelectric actuator according to claim 1, wherein each of the first piezoelectric sheets has at least one dummy electrode to be aligned, in the laminating direction, with the at least one end portion of the inner common electrode on each of the second piezoelectric sheets, and each of the second piezoelectric sheets has dummy electrodes to be aligned, in the laminating direction, with the end portions of corresponding ones of the inner individual electrodes on the first piezoelectric sheets, and the conductive material in each of the through-holes continues to a corresponding one of the end portions of the inner individual electrodes, the end portions of the inner common electrodes, and the dummy electrodes.

4. The piezoelectric actuator according to claim 1, wherein the through-holes formed in one of adjacent first and second piezoelectric sheets are not coaxial, in the laminating direction, with the through-holes formed in the other of the adjacent first and second piezoelectric sheets.

5. The piezoelectric actuator according to claim 3, wherein the conductive material in each of the through-holes formed in one of adjacent first and second piezoelectric sheets makes contact, at least partially, with a corresponding one of the end portions of the inner individual electrodes, the end portions of the inner common electrodes, and the dummy electrodes that is continuously formed to the conductive material in an adjacent one of the through-holes formed in the other of the adjacent first and second piezoelectric sheets.

6. The piezoelectric actuator according to claim 4, wherein the through-holes are formed in the first piezoelectric sheets at different positions from the through-holes formed in the second piezoelectric sheets, and the through-holes are arranged in a staggered configuration in the laminating direction of the first and second piezoelectric sheets.

7. The piezoelectric actuator according to claim 1, further comprising at least one restraining sheet that is disposed on the laminated first and second piezoelectric sheets to restrain deformation in the laminated first and second piezoelectric sheets.

8. The piezoelectric actuator according to claim 7, further comprising a top sheet disposed on the at least one restraining sheet, wherein the top sheet has, on its external surface, surface electrodes to be aligned with corresponding ones of the inner individual electrodes on the first piezoelectric sheets and with the at least one end portion of the inner common electrode on each of the second piezoelectric sheets, and additional through-holes are formed in the top sheet and the at least one restraining sheet and coated with the conductive material such that the surface electrodes are electrically connected, in the laminating direction, to the corresponding ones of the inner individual electrodes and to the inner common electrodes.

9. A piezoelectric actuator, comprising:
first piezoelectric sheets each having inner individual electrodes; and
second piezoelectric sheets each having an inner common electrode, the first and second piezoelectric sheets being laminated alternately,
wherein first through-holes are formed in the first and second piezoelectric sheets and coated with a conductive material such that the inner individual electrodes are electrically connected with one another in a laminating direction of the first and second piezoelectric sheets, and second through-holes are formed in the first and second piezoelectric sheets and coated with the conductive material such that the inner common electrodes are electrically connected with one another in the laminating direction, and wherein the first through-holes formed in adjacent first and second sheets are not coaxially aligned, and the second through-holes formed in adjacent first and second sheets are not coaxially aligned, and each of the first and second through-holes has a maximum diameter of not less than about 20 $\mu$m and not more than about 200 $\mu$m.

10. The piezoelectric actuator according to claim 9, wherein each of the first piezoelectric sheets has at least one dummy common electrode to be aligned, in the laminating direction, with the inner common electrode on each of the second piezoelectric sheets, and each of the second piezoelectric sheets has dummy individual electrodes to be aligned, in the laminating direction, with corresponding ones of the inner individual electrodes, and wherein the inner common electrodes on the second piezoelectric sheets are electrically connected with one another in the laminating direction via the conductive materials in the second through-holes and the dummy common electrodes, and the inner individual electrodes on the first piezoelectric sheets are electrically connected with one another in the laminating direction via the conductive materials in corresponding ones of the first through-holes and corresponding ones of the dummy individual electrodes.

11. The piezoelectric actuator according to claim 10, wherein the conductive material in each of the first through-holes continues, at its one end, to one of opposed inner and dummy individual electrodes and contacts, at its other end, the other of the opposed inner and dummy individual electrodes, and wherein the conductive material in each of the second through-holes continues, at its one end, to one of opposed inner and dummy common electrodes and contacts, at its other end, the other of the opposed inner and dummy common electrodes.

12. The piezoelectric actuator according to claim 9, wherein the first and second through-holes are arranged in a staggered configuration in the laminating direction of the first and second piezoelectric sheets.

13. The piezoelectric actuator according to claim 10, further comprising a restraining sheet that is disposed on the laminated first and second piezoelectric sheets to restrain deformation in the laminated first and second piezoelectric sheets, wherein the restraining sheet has an inner common electrode and dummy individual electrodes that are identical in pattern with the inner common electrode and the dummy individual electrodes on each of the second piezoelectric sheets, and additional through-holes are formed in the restraining sheet and coated with the conductive material such that the inner common electrode and the dummy individual electrodes on the restraining sheet are respectively electrically connected, in the laminating direction, with the inner common electrodes and corresponding ones of the inner individual electrodes.

14. An ink-jet head, comprising:
a cavity plate formed with pressure chambers and nozzles each communicating with a corresponding one of the pressure chambers; and
a piezoelectric actuator including:
first piezoelectric sheets extending across the pressure chambers, each sheet having inner individual electrodes each aligned with a corresponding one of the pressure chambers; and
second piezoelectric sheets extending across the pressure chambers, each sheet having an inner common electrode extending across the pressure chambers, the first and second piezoelectric sheets being laminated alternately, wherein through-holes are formed in the first and second piezoelectric sheets and coated with a conductive material such that the inner individual electrodes are electrically connected, at their end portions, with one another in a laminating direction of the first and second piezoelectric sheets and that the common electrodes are electrically connected, at their at least one end portion, with one another in the laminating direction, and a maximum diameter of each of the through-holes is not less than about 20 $\mu$m and not more than about 200 $\mu$m.

15. The ink-jet head according to claim 14, wherein the through-holes are not formed in a bottom one of the laminated first and second piezoelectric sheets.

16. The ink-jet head according to claim 14, wherein each of the first piezoelectric sheets has at least one dummy electrode to be aligned, in the laminating direction, with the at least one end portion of the inner common electrode on each of the second piezoelectric sheets, and each of the second piezoelectric sheets has dummy electrodes to be aligned, in the laminating direction, with the end portions of corresponding ones of the inner individual electrodes on the first piezoelectric sheets, and the conductive material in each of the through-holes continues to a corresponding one of the end portions of the inner individual electrodes, the end portions of the inner common electrodes, and the dummy electrodes.

17. The ink-jet head according to claim 14, wherein the through-holes formed in one of adjacent first and second piezoelectric sheets are not coaxial, in the laminating direction, with the through-holes formed in the other of the adjacent first and second piezoelectric sheets.

18. The ink-jet head according to claim 16, wherein the conductive material in each of the through-holes formed in one of adjacent first and second piezoelectric sheets makes contact, at least partially, with a corresponding one of the end portions of the inner individual electrodes, the end portions of the inner common electrodes, and the dummy electrodes that is continuously formed to the conductive material in an adjacent one of the through-holes formed in the other of the adjacent first and second piezoelectric sheets.

19. The ink-jet head according to claim 17, wherein the through-holes are formed in the first piezoelectric sheets at different positions from the through-holes formed in the second piezoelectric sheets, and the through-holes are arranged in a staggered configuration in the laminating direction of the first and second piezoelectric sheets.

20. The ink-jet head according to claim 14, further comprising at least one restraining sheet that is disposed on the laminated first and second piezoelectric sheets to restrain deformation in the laminated first and second piezoelectric sheets.

21. The ink-jet head according to claim 20, further comprising a top sheet disposed on the at least one restraining sheets, wherein the top sheet has, on its external surface, surface electrodes to be aligned with corresponding ones of the inner individual electrodes on the first piezoelectric sheets and with the at least one end portion of the inner common electrode on each of the second piezoelectric sheets, and additional through-holes are formed in the top sheet and the at least one restraining sheet and coated with the conductive material such that the surface electrodes are electrically connected, in the laminating direction, to the corresponding ones of the inner individual electrodes and to the inner common electrodes.

22. A printer having at least one ink-jet print head, the at least one ink-jet print head comprising:

a cavity plate having a plurality of pressure chambers, each pressure chamber associated with an ejection nozzle; and a piezoelectric actuator comprising:

a top sheet having a plurality of surface electrodes on a top surface, a through-hole passing through each surface electrode and the top sheet;

at least one restraining sheet mounted to a bottom surface of the top sheet, each restraining sheet having a common electrode, the common electrode having a plurality of common portions common to the common electrode and a plurality of dummy electrodes separated from the common electrode, a through-hole passing through each common portion and each dummy electrode and the restraining sheet;

a plurality of first sheets, each first sheet having a plurality of individual electrodes and a plurality of dummy electrodes, one first sheet forming a bottom sheet with no through-holes, remaining first sheets having a through-hole passing through each individual electrode and each dummy electrode and the first sheet; and a plurality of second sheets, each second sheet having an electrode pattern and a through-hole pattern the same as the at least one restraining sheet, wherein the plurality of second sheets and the plurality of first sheets alternate and the through-holes from the top sheet to the electrodes of the one first sheet are electrically aligned in a substantially linear orientation although having radial offset from sheet to sheet.

23. The printer according to claim 22, wherein the through-holes are lined with an electrically conductive material.

24. The printer according to claim 23, wherein the through-holes have a conical shape from top to bottom.

25. The printer according to claim 24, wherein a bottom of a through-hole does not overlap a top of an adjacent through-hole.

26. The printer according to claim 22, further comprising a flat cable connected to at least a portion of the surface electrodes of the top sheet.

27. The printer according to claim 22, wherein the through-holes have a maximum diameter of not less than about 20 $\mu$m and not greater than about 200 $\mu$m.

* * * * *